(12) United States Patent
Liu et al.

(10) Patent No.: US 11,693,062 B2
(45) Date of Patent: Jul. 4, 2023

(54) METHOD FOR PROCESSING DIRECT CURRENT ELECTRIC ARC AND APPARATUS

(71) Applicant: HUAWEI TECHNOLOGIES CO., LTD., Guangdong (CN)

(72) Inventors: Fangcheng Liu, Shanghai (CN); Kai Xin, Shanghai (CN); Yunfeng Liu, Shanghai (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 132 days.

(21) Appl. No.: 16/913,828

(22) Filed: Jun. 26, 2020

(65) Prior Publication Data

US 2020/0326385 A1 Oct. 15, 2020

Related U.S. Application Data

(63) Continuation of application No. PCT/CN2017/120040, filed on Dec. 29, 2017.

(51) Int. Cl.
*G01R 31/52* (2020.01)
*H02H 7/20* (2006.01)
(Continued)

(52) U.S. Cl.
CPC ............ *G01R 31/52* (2020.01); *G01R 31/00* (2013.01); *H02H 1/0015* (2013.01);
(Continued)

(58) Field of Classification Search
CPC .......... G01R 31/52; G01R 31/00; H02H 7/20; H02H 1/0092; H02H 3/33; H02H 1/0015; Y02E 10/50; H02S 50/00
See application file for complete search history.

(56) References Cited

U.S. PATENT DOCUMENTS

2007/0133135 A1* 6/2007 Kilroy ................ H02H 1/0015
361/42
2009/0284265 A1 11/2009 Ohta et al.
(Continued)

FOREIGN PATENT DOCUMENTS

CN 102253293 A 11/2011
CN 103913663 A 7/2014
(Continued)

*Primary Examiner* — Feba Pothen
*Assistant Examiner* — Joseph O Nyamogo
(74) *Attorney, Agent, or Firm* — Womble Bond Dickinson (US) LLP

(57) ABSTRACT

A method for processing a direct current electric arc and an apparatus, includes: obtaining a first current which is a direct current input current of a direct current cable of a photovoltaic cell system; obtaining a second current, where the second current is a direct current common mode current of a direct current cable or an alternating current common mode current of an alternating current cable; calculating a correlation coefficient between a frequency domain component of the first current and a frequency domain component of the second current; and when determining that the first current meets an electric arc occurrence condition and the correlation coefficient is greater than or equal to a preset coefficient threshold, skipping sending a direct current electric arc fault alarm. The correlation coefficient is used to reflect a proportion of common mode noise generated by the second current, and the preset coefficient threshold is set.

20 Claims, 12 Drawing Sheets

(51) Int. Cl.
   *H02H 1/00*    (2006.01)
   *H02H 3/33*    (2006.01)
   *G01R 31/00*   (2006.01)
   *H02S 50/00*   (2014.01)

(52) U.S. Cl.
   CPC ............ *H02H 1/0092* (2013.01); *H02H 3/33* (2013.01); *H02H 7/20* (2013.01); *H02S 50/00* (2013.01); *Y02E 10/50* (2013.01)

(56) References Cited

U.S. PATENT DOCUMENTS

2015/0309104 A1   10/2015   Möll et al.
2017/0117699 A1   4/2017    Ostrovsky et al.

FOREIGN PATENT DOCUMENTS

| CN | 104597344 A |   | 5/2015 |
| CN | 104730433 A |   | 6/2015 |
| CN | 104811135 A |   | 7/2015 |
| CN | 104597344   | * | 5/2017 |
| CN | 106771691   | * | 5/2017 |
| CN | 106771691 A |   | 5/2017 |
| EP | 1796238 A2  |   | 6/2007 |

* cited by examiner

METHOD FOR PROCESSING DIRECT CURRENT ELECTRIC ARC AND APPARATUS

CROSS-REFERENCE TO RELATED APPLICATIONS

This application is a continuation of International Application No. PCT/CN2017/120040, filed on Dec. 29, 2017, the disclosure of which is hereby incorporated by reference in its entirety.

TECHNICAL FIELD

The present disclosure relates to the photovoltaic field, and specifically, to a method for processing a direct current electric arc and an apparatus.

BACKGROUND

With large-scale application of photovoltaic power generation, photovoltaic-system fire accidents occurred in a plurality of regions in succession, causing some financial losses and endangering personal safety. Subsequent investigation of such accidents found that most electrical fires result from a faulty electric arc at a direct current end. Once a faulty electric arc occurs at a direct current end of a photovoltaic power generation system, the faulty electric arc is relatively difficult to determine because the faulty electric arc has no zero crossing point characteristic like an alternating current faulty electric arc. In addition, due to continuous sunlight casting, energy is continuously injected into the faulty electric arc, causing a temperature of a contact portion to rise sharply. With the high temperature, surrounding components are carbonized. Consequently, fuses and cables may be fused, or even components and devices may be burnt to cause a fire.

Currently, it is found that a direct current electric arc fault may cause an increase in current noise in a direct current cable of a photovoltaic system. Therefore, a main idea of an existing direct current electric arc fault detection method is that based on an indirect relationship between the current noise and the direct current electric arc fault, whether a direct current electric arc fault occurs is determined based on a magnitude of the current noise in the direct current cable. A method for obtaining the current noise in the direct current cable is: first sampling a current of the direct current cable, and then performing FFT or wavelet transform on a sampling result, to obtain a corresponding noise frequency current component.

However, in the photovoltaic system, a photovoltaic cell panel with a relatively large area may form a relatively large grounding capacitance, causing an apparent ground leakage current loop. Therefore, in the direct current cable, there is not only a faulty current but also a relatively large common mode current. If common mode current noise is relatively large, an electric arc detection system is affected when no direct current electric arc fault actually occurs, and consequently a false alarm is generated, affecting normal operation of the photovoltaic system.

SUMMARY

Embodiments of the present disclosure provide a method for processing a direct current electric arc and an apparatus, to resolve a problem that a false alarm caused by relatively large common mode current noise in a photovoltaic system affects normal operation of the photovoltaic system.

A first aspect of the embodiments of the present disclosure provides a method for processing a direct current electric arc. In this method, first, a first current is obtained, where the first current is a direct current input current of a direct current cable connected to a photovoltaic cell panel of a photovoltaic cell system. Then, a second current is obtained, where the second current is a direct current common mode current of a direct current cable on a direct current port side of an inverter of the photovoltaic cell system or an alternating current common mode current of an alternating current cable on an alternating current port side of the inverter. After the currents are obtained, a correlation coefficient between a frequency domain component of the first current and a frequency domain component of the second current may be calculated based on the frequency domain component of the first current and the frequency domain component of the second current. Then, condition-based determining is performed, and if it is found that the first current meets an electric arc occurrence condition and the calculated correlation coefficient is greater than a preset coefficient threshold, a direct current electric arc fault alarm is not sent.

It can be learned that, it can be determined that an alarm is still not required in some cases when the first current meets the electric arc occurrence condition. Although total current noise is relatively large, differential mode noise is actually relatively small, and common mode noise is relatively large. Because the common mode noise actually affects a circuit very slightly, the circuit is in a normal operation state. In this embodiment of the present disclosure, the calculated correlation coefficient between the frequency domain component of the first current and the frequency domain component of the second current is used to reflect a proportion of common mode noise generated by the second current, and the preset coefficient threshold is set. If the correlation coefficient is greater than the coefficient threshold, it indicates that the first current meets the electric arc occurrence condition because the common mode noise is relatively large. In this case, no alarm needs to be sent. This avoids a false alarm in this case, thereby reducing interference on normal operation of the inverter, and improving product performance. In addition, the direct current cable current and the common mode current that are used to calculate the correlation coefficient can be sampled synchronously, and are both sampling results under a same working condition. Therefore, impact of a working condition change of a photovoltaic power generation system on a detection result can be alleviated.

In some embodiments, determining that the first current meets the electric arc occurrence condition may be: first, performing frequency domain decomposition on the first current to obtain a first frequency range, where the first frequency range is a frequency band in which electric arc noise occurs; then, calculating a standard deviation of a current frequency value in the first frequency range; and obtaining a quantity N of times that the standard deviation is greater than a first threshold in a preset time period, and when N is greater than a second threshold, determining that the first current meets the electric arc occurrence condition, where N is an integer that is greater than or equal to 0. Whether the first current has a direct current electric arc can be relatively accurately determined by determining the quantity of times.

In some embodiments, the quantity N of times that the standard deviation is greater than the first threshold in the preset time period is obtained through counting of a sliding window. A relatively accurate quantity N of times can be obtained in this manner.

In some embodiments, the correlation coefficient between the frequency domain component of the first current and the frequency domain component of the second current may be calculated in the following manner: first, separately calculating a standard deviation of the frequency domain component of the first current and a standard deviation of the frequency domain component of the second current; then, calculating a covariance between the frequency domain component of the first current and the frequency domain component of the second current; and finally, calculating the correlation coefficient between the frequency domain component of the first current and the frequency domain component of the second current based on the standard deviations and the covariance. The correlation coefficient can reflect a degree of correlation between the frequency domain component of the first current and the frequency domain component of the second current. Whether the system is to send an alarm can be relatively accurately determined based on the degree of correlation.

In some embodiments, the standard deviation $s_x$ of the frequency domain component of the first current x is calculated by using the following formula:

$$s_x = \sqrt{\frac{\sum (x_i - \bar{x})^2}{n-1}},$$

where n is a quantity of sampling times of the frequency domain component of the first current;

the standard deviation $s_y$ of the frequency domain component of the second current y is calculated by using the following formula:

$$s_y = \sqrt{\frac{\sum (y_i - \bar{y})^2}{n-1}},$$

where n is a quantity of sampling times of the frequency domain component of the second current;

the covariance $s_{xy}$ between the frequency domain component of the first current and the frequency domain component of the second current is calculated by using the following formula:

$$s_{xy} = \frac{\sum (x_i - \bar{x})(y_i - \bar{y})}{n-1};$$

and the correlation coefficient $r_{xy}$ between the frequency domain component of the first current and the frequency domain component of the second current is calculated by using the following formula:

$$r_{xy} = \frac{s_{xy}}{s_x s_y}.$$

In some embodiments, when the first current meets the electric arc occurrence condition and the calculated correlation coefficient is greater than the preset coefficient threshold, no direct current electric arc fault alarm is sent. Further, when the first current meets the electric arc occurrence condition and the correlation coefficient is less than the preset coefficient threshold, a direct current electric arc fault alarm is sent. Therefore, a normal direct current electric arc fault alarm is sent after the condition-based determining succeeds. In this way, alarm performance of the system is not affected.

In some embodiments, the first current is a current obtained by performing sampling on a positive bus bar or a negative bus bar of the direct current cable, and the second current is a current obtained by performing sampling on all alternating current cables on the alternating current port side of the inverter. In other words, the first current is a direct current input current, and the second current is an alternating current common mode current.

In some embodiments, if the first current is a direct current input current, and the second current is an alternating current common mode current, electric arc analysis is performed on the first current before the correlation coefficient between the frequency domain component of the first current and the frequency domain component of the second current is calculated. The correlation coefficient is calculated only when the first current meets the electric arc occurrence condition, in other words, when it is determined, based only on the first current, that a direct current electric arc fault is likely to occur. Otherwise, the correlation coefficient does not need to be calculated.

In some embodiments, if the first current is a direct current input current, and the second current is an alternating current common mode current, when it is determined that the first current meets the electric arc occurrence condition, the correlation coefficient is greater than or equal to the preset coefficient threshold, and the second current meets the electric arc occurrence condition, no direct current electric arc fault alarm is sent.

In some embodiments, if the first current is a direct current input current, and the second current is an alternating current common mode current, when it is determined that the first current meets the electric arc occurrence condition, the correlation coefficient is greater than or equal to the preset coefficient threshold, and the second current does not meet the electric arc occurrence condition, a direct current electric arc fault alarm is sent.

In some embodiments, the first current is a current obtained by performing sampling on a positive bus bar or a negative bus bar of the direct current cable, and the second current is a current obtained by performing sampling on all direct current cables on the direct current port side of the inverter. In other words, the first current is a direct current input current, and the second current is a direct current common mode current.

In some embodiments, if the first current is a direct current input current, and the second current is a direct current common mode current, after the correlation coefficient between the frequency domain component of the first current and the frequency domain component of the second current is calculated, if it is found that the correlation coefficient is less than the preset coefficient threshold, electric arc analysis is performed on the first current.

A second aspect of the embodiments of the present disclosure further provides an apparatus for detecting a direct current electric arc. The apparatus includes an electric arc fault processing module, and a first sampling module and a second sampling module that are connected to the processing unit. The first sampling module is configured to perform sampling to obtain a first current, and the second sampling module is configured to perform sampling to obtain a second current. There may be two location setting cases for the first sampling module and the second sampling module in a photovoltaic cell system. In a first case, both the first sampling module and the second sampling module are disposed on direct current cables. In a second case, the first sampling module is disposed on a direct current cable, but the second sampling module is disposed on an alternating current cable on an alternating current port side of an inverter. Then, the electric arc fault processing module receives the first current and the second current, and executes corresponding determining logic: first, calculating a frequency domain component of the first current and a frequency domain component of the second current; then, calculating a correlation coefficient between the two frequency domain components, where the frequency domain component is a frequency value of a current within a preset frequency band in frequency domain, and the correlation coefficient reflects a degree of correlation between the frequency domain component of the first current and the frequency domain component of the second current; and finally, performing condition-based determining, where when the electric arc fault processing module determines that the first current meets an electric arc occurrence condition and the correlation coefficient is greater than or equal to a preset coefficient threshold, the electric arc fault processing module does not send a direct current electric arc fault alarm.

In some embodiments, the first sampling module is a direct current cable current sampling module, and the first current is a direct current input current obtained by the direct current cable current sampling module by performing sampling on a positive bus bar or a negative bus bar of a direct current cable. The second sampling module is a common mode current sampling module, and when the common mode current sampling module is disposed on a direct current cable on a direct current port side of the inverter, the common mode current sampling module performs sampling on all direct current cables, to obtain a direct current common mode current, or when the common mode current sampling module is disposed on the alternating current cable on the alternating current port side of the inverter, the common mode current sampling module performs sampling on all alternating current cables, to obtain an alternating current common mode current.

In some embodiments, the direct current cable current sampling module has a plurality of implementations. In one of the implementations, the direct current cable current sampling module includes a first sampling coil and a first sampling control unit, the positive bus bar or the negative bus bar of the direct current cable runs through the first sampling coil, and the sampling control unit is configured to convert a current sampled by the first sampling coil into the direct current input current.

In some embodiments, the common mode current sampling module has a plurality of implementations. In one of the implementations, the common mode current sampling module includes a second sampling coil and a second sampling control unit, and when the common mode current sampling module performs sampling on the direct current cables, all the direct current cables run through the second sampling coil, or when the common mode current sampling module performs sampling on the alternating current cables, all the alternating current cables run through the second sampling coil.

In some embodiments, that the electric arc fault processing module determines that the first current meets an electric arc occurrence condition may be: first, performing frequency domain decomposition on the first current to obtain a first frequency range, where the first frequency range is a frequency band in which electric arc noise occurs; then, calculating a standard deviation of a current frequency value in the first frequency range; and obtaining a quantity N of times that the standard deviation is greater than a first threshold in a preset time period, and when N is greater than a second threshold, determining that the first current meets the electric arc occurrence condition, where N is an integer that is greater than or equal to 0. Whether the first current has a direct current electric arc can be relatively accurately determined by determining the quantity of times.

In some embodiments, the electric arc fault processing module obtains, through counting of a sliding window, the quantity N of times that the standard deviation is greater than the first threshold in the preset time period. A relatively accurate quantity N of times can be obtained in this manner.

In some embodiments, the electric arc fault processing module may calculate the correlation coefficient between the frequency domain component of the first current and the frequency domain component of the second current in the following manner: first, separately calculating a standard deviation of the frequency domain component of the first current and a standard deviation of the frequency domain component of the second current; then, calculating a covariance between the frequency domain component of the first current and the frequency domain component of the second current; and finally, calculating the correlation coefficient between the frequency domain component of the first current and the frequency domain component of the second current based on the standard deviations and the covariance. The correlation coefficient can reflect a degree of correlation between the frequency domain component of the first current and the frequency domain component of the second current. Whether the system is to send an alarm can be relatively accurately determined based on the degree of correlation.

In some embodiments, the standard deviation $s_x$ of the frequency domain component of the first current x is calculated by using the following formula:

$$s_x = \sqrt{\frac{\sum (x_i - \bar{x})^2}{n-1}},$$

where n is a quantity of sampling times of the frequency domain component of the first current;

the standard deviation $s_y$ of the frequency domain component of the second current y is calculated by using the following formula:

$$s_y = \sqrt{\frac{\sum (y - \bar{y})^2}{n-1}},$$

where n is a quantity of sampling times of the frequency domain component of the second current;

the covariance $s_{xy}$ between the frequency domain component of the first current and the frequency domain component of the second current is calculated by using the following formula:

$$s_{xy} = \frac{\sum(x_i - \bar{x})(y_i - \bar{y})}{n-1};$$

and the correlation coefficient $r_{xy}$ between the frequency domain component of the first current and the frequency domain component of the second current is calculated by using the following formula:

$$r_{xy} = \frac{s_{xy}}{s_x s_y}.$$

In some embodiments, when the first current meets the electric arc occurrence condition and the calculated correlation coefficient is greater than the preset coefficient threshold, the electric arc fault processing module does not send a direct current electric arc fault alarm. Further, when determining that the first current meets the electric arc occurrence condition and the correlation coefficient is less than the preset coefficient threshold, the electric arc fault processing module sends a direct current electric arc fault alarm. Therefore, a normal direct current electric arc fault alarm is sent after the condition-based determining succeeds. In this way, alarm performance of the system is not affected.

In some embodiments, when the second current is an alternating current common mode current, the electric arc fault processing module further performs electric arc analysis on the first current, and then performs determining. The correlation coefficient is calculated only when the first current meets the electric arc occurrence condition, in other words, when it is determined, based only on the first current, that a direct current electric arc fault is likely to occur. Otherwise, the correlation coefficient does not need to be calculated.

In some embodiments, when the second current is an alternating current common mode current, when determining that the first current meets the electric arc occurrence condition, the correlation coefficient is greater than or equal to the preset coefficient threshold, and the second current meets the electric arc occurrence condition, the electric arc fault processing module does not send a direct current electric arc fault alarm.

In some embodiments, when the first current is a direct current input current, and the second current is an alternating current common mode current, the electric arc fault processing module is further configured to: when determining that the first current meets the electric arc occurrence condition, the correlation coefficient is greater than or equal to the preset coefficient threshold, and the second current does not meet the electric arc occurrence condition, send a direct current electric arc fault alarm.

In some embodiments, when the second current is a direct current common mode current, after calculating the correlation coefficient between the frequency domain component of the first current and the frequency domain component of the second current, if the electric arc fault processing module finds that the correlation coefficient is less than the preset coefficient threshold, the electric arc fault processing module performs electric arc analysis on the first current.

DESCRIPTION OF EMBODIMENTS

Embodiments of the present disclosure provide a method for processing a direct current electric arc and an apparatus, to resolve a problem that a false alarm caused by relatively large common mode current noise in a photovoltaic system affects normal operation of the photovoltaic system.

To make persons skilled in the art understand the technical solutions in the present disclosure better, the following describes the embodiments of the present disclosure with reference to the accompanying drawings in the embodiments of the present disclosure.

In the specification, claims, and accompanying drawings of the present disclosure, the terms "first", "second", "third", "fourth", and the like (if existent) are intended to distinguish between similar objects but are not necessarily intended to describe a specific order or sequence. It should be understood that the data termed in such a way are interchangeable in proper circumstances, so that the embodiments described herein can be implemented in other orders than the order illustrated or described herein. Moreover, the terms "include", "have", and any other variants thereof are intended to cover the non-exclusive inclusion. For example, a process, method, system, product, or device that includes a series of operations or units is not necessarily limited to those operations or units that are expressly listed, but may include other operations or units that are not expressly listed or inherent to such a process, method, system, product, or device.

In 2011, the NEC Corporation formulated a regulation that a faulty electric arc detection apparatus and a breaker need to be added to a photovoltaic system, and formulated an industry standard of the photovoltaic system, to ensure stable, safe, and reliable operation of the photovoltaic system. Causes of a direct current electric arc of the photovoltaic system are of great randomness, and both an occurrence location and occurrence time of the direct current electric arc are unpredictable. An electric arc fault may be caused by severe cable and line weathering, direct current line breakage, electronic component aging, connecting contact point looseness, animal gnawing, or the like. A relatively large quantity of incidental factors make it impossible to accurately establish a mathematical model to directly determine whether a direct current electric arc fault occurs in the photovoltaic system.

Figure 1:
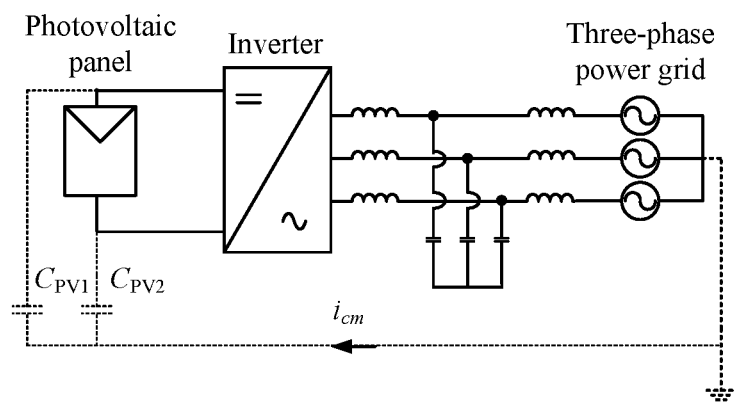
FIG. 1 is a schematic diagram of a photovoltaic power generation system.

In the existing research, by comparing a plurality of experimental results, researchers find that a direct current electric arc fault may cause an increase in current noise in a direct current cable of the photovoltaic system. Therefore, a main idea of an existing direct current electric arc fault detection method is that based on an indirect relationship between the current noise and the direct current electric arc fault, whether a direct current electric arc fault occurs is determined based on a magnitude of the current noise in the direct current cable. A method for obtaining the current noise in the direct current cable is: first sampling a current of the direct current cable, and then performing FFT or wavelet transform on a sampling result, to obtain a corresponding noise frequency current component. However, in the photovoltaic system, a photovoltaic cell panel with a relatively large area may form a relatively large grounding capacitance, causing an apparent ground leakage current loop. Therefore, in the direct current cable, there is not only a faulty current but also a relatively large common mode current. FIG. 1 is a schematic diagram of a photovoltaic power generation system. If common mode current noise is relatively large, an electric arc detection system is affected when no direct current electric arc fault actually occurs, and consequently a false alarm is generated, affecting normal operation of the photovoltaic system. Therefore, during direct current electric arc detection of the photovoltaic system, how to suppress common mode current interference to improve detection system accuracy is a very crucial issue.

Figure 2A:
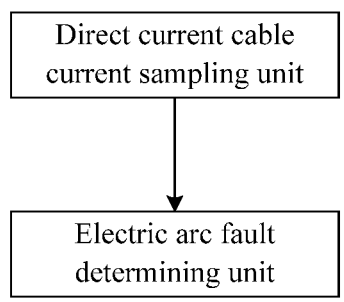
FIG. 2a is a schematic diagram of detecting a direct current electric arc.
Figure 2B:
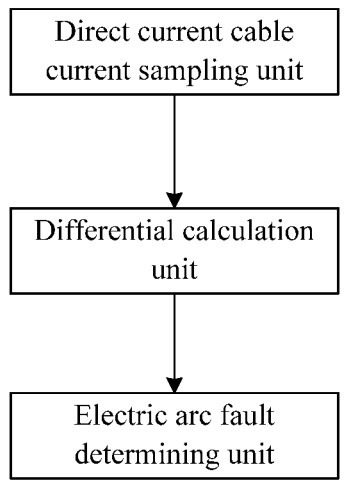
FIG. 2b is another schematic diagram of detecting a direct current electric arc.
Figure 3:
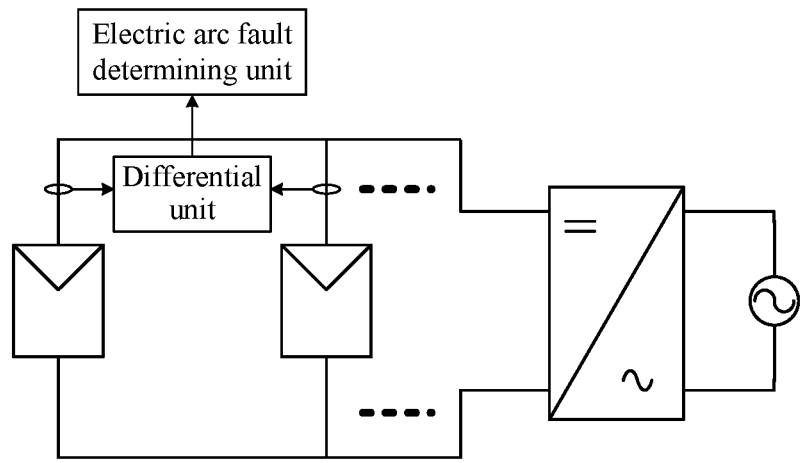
FIG. 3 is a schematic structural diagram of a differential suppression method of adjacent photovoltaic branches.

Currently, technologies used to detect the direct current electric arc mainly include two systems. FIG. 2a is a schematic diagram of detecting a direct current electric arc, and FIG. 2b is another schematic diagram of detecting a direct current electric arc. It can be seen that in FIG. 2a, a direct current cable current sampling unit mainly samples a direct current cable current, and then an electric arc fault determining unit determines, based on the direct current cable current, whether an electric arc fault occurs. In FIG. 2b, compared with FIG. 2a, a differential calculation unit is added to process sampled currents, and then whether an electric arc fault occurs is determined based on a differential calculation result of the direct current cable current. It can be learned that only a same type of current sampling unit (a quantity of current sampling units varies with a quantity of photovoltaic string branches) is used in both cases, and fault diagnosis is directly performed based on a sampling result, or fault diagnosis is performed after differential calculation is performed on the sampling result (to reduce common mode current interference). In the photovoltaic system, a determining result of the method in FIG. 2a may be affected by the common mode current, and a determining result of the method in FIG. 2b is also affected by the common mode current because accurate calculation is difficult to implement. The method in FIG. 2b is analyzed to illustrate a reason why accurate calculation is difficult to implement. The following describes two existing measurement methods:

Method 1: FIG. 3 is a schematic structural diagram of a differential suppression method of adjacent photovoltaic branches. In this method, direct current cable currents of the adjacent photovoltaic cell panel branches are sampled; then, the sampled currents of the adjacent branches are sent to a differential unit to perform differential calculation, to cancel a common mode current component in the measured currents; and finally, a calculated direct current cable current that does not include the common mode current component is sent to an electric arc fault determining unit to perform noise detection, to determine whether a direct current electric arc fault occurs in a system.

However, this manner has two relatively obvious disadvantages. One disadvantage is that this manner is applicable only to a photovoltaic power generation system having a plurality of photovoltaic inputs, namely, a centralized photovoltaic power generation system. If a photovoltaic system has only one string, there is no adjacent photovoltaic cell panel branches, and therefore a plurality of detection currents cannot be obtained to perform differential calculation. For example, this manner cannot be applied to a string photovoltaic power generation system and a household small-size photovoltaic power generation system, and therefore application scenarios of this manner are very limited. The other disadvantage is that real-time differential calculation on currents of adjacent branches is implemented with great difficulty and very low accuracy in actual application. It is very likely that operating statuses of adjacent photovoltaic strings greatly differ from each other due to a shadow, a covering, a direction, and inconsistency of photovoltaic panels, and consequently common mode currents flowing through the adjacent photovoltaic strings differ in magnitude. In addition, a sunlight change of the photovoltaic power generation system results in a change of a system operating point, and it can be said that a status of the whole system changes in real time. All these factors make differential calculation very difficult, and therefore differential gains need to be very accurately balanced in real time.

Figure 4:
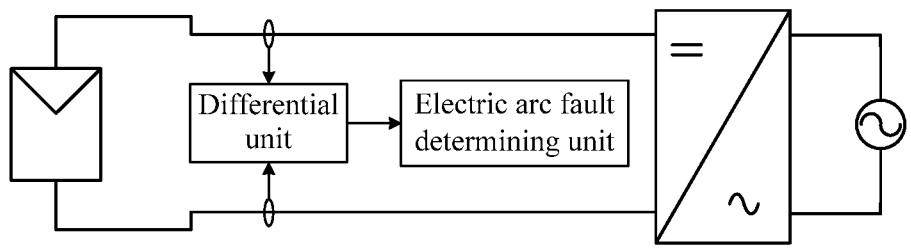
FIG. 4 is a schematic structural diagram of a differential suppression method of a positive direct current bus bar and a negative direct current bus bar.
Figure 5:
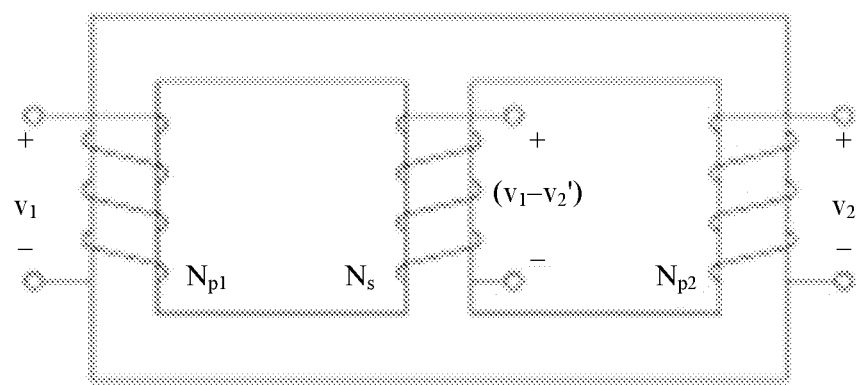
FIG. 5 is a schematic diagram of a three-winding or three-column transformer.

Method 2: FIG. 4 is a schematic structural diagram of a differential suppression method of a positive direct current bus bar and a negative direct current bus bar, and FIG. 5 is a schematic diagram of a three-winding or three-column transformer. In this method, a positive bus bar current and a negative bus bar current of photovoltaic cell panel direct current bus bars are sampled; then, the sampled currents of adjacent like positive bus bar current and negative bus bar current branches are sent to a differential unit to perform differential calculation, to cancel a common mode current component in the measured currents; and finally, a calculated direct current cable current that does not include the common mode current component is sent to an electric arc fault determining unit to perform noise detection, to determine whether a direct current electric arc fault occurs in a system. The differential unit has different implementations: using the differential calculation unit to perform cancellation in a sampling portion, or using the three-winding or three-column transformer shown in FIG. 5 to directly perform magnetic circuit cancellation.

This method is relatively applicable to a normal power supply system. However, in the photovoltaic system, a photovoltaic cell system is installed in a plurality of manners, for example, the positive bus bar is grounded, the negative bus bar is grounded, and neither the positive bus bar nor the negative bus bar is grounded. As a result, the direct current positive bus bar and negative bus bar in a common mode current loop are inconsistent in equivalent common mode impedance, and therefore are also inconsistent in common mode current. This makes differential calculation difficult. Problems in actual application are similar to those of the method 1, to be specific, an operating status of the photovoltaic power generation system is greatly affected by external factors and changes in real time. Therefore, it is difficult to balance gains during differential calculation, causing relatively low calculation accuracy.

It can be learned from the foregoing several manners that a general solution is to obtain, through numerical calculation, a relatively accurate direct current cable current that does not include a common mode current component, and then determine whether a current electric arc fault occurs. However, due to a relatively large change in an actual running status of the photovoltaic system, an accurate numerical calculation method is difficult to implement, causing a relatively large calculation error.

In view of the foregoing problem, for the photovoltaic power generation system subject to a relatively large quantity of incidental factors, the present disclosure provides a method for detecting a direct current electric arc. This method is based on a correlation theory in statistics, and different variables used to calculate correlation can be sampled synchronously. Therefore, this method is insensitive to a change of an actual working condition of the photovoltaic system, and therefore has higher accuracy than the existing accurate numerical calculation method.

Figure 6:
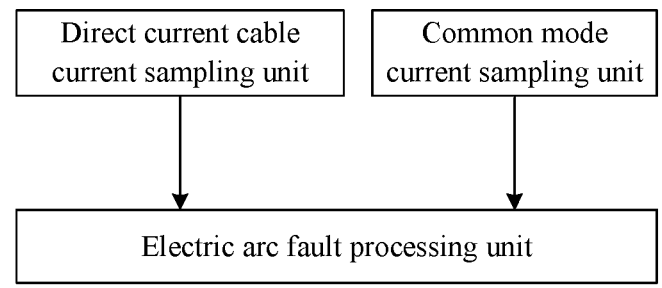
FIG. 6 is a schematic architectural diagram of a method for processing a direct current electric arc fault according to an embodiment of the present disclosure.
Figure 7A:
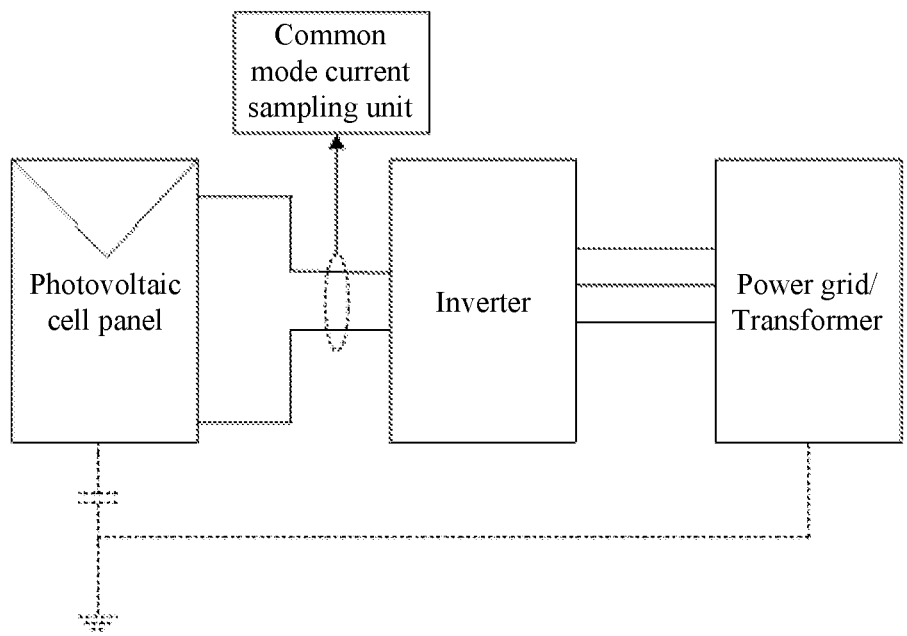
FIG. 7a is a schematic diagram in which a common mode current sampling unit is connected to a direct current port side in an architecture according to an embodiment of the present disclosure.
Figure 7B:
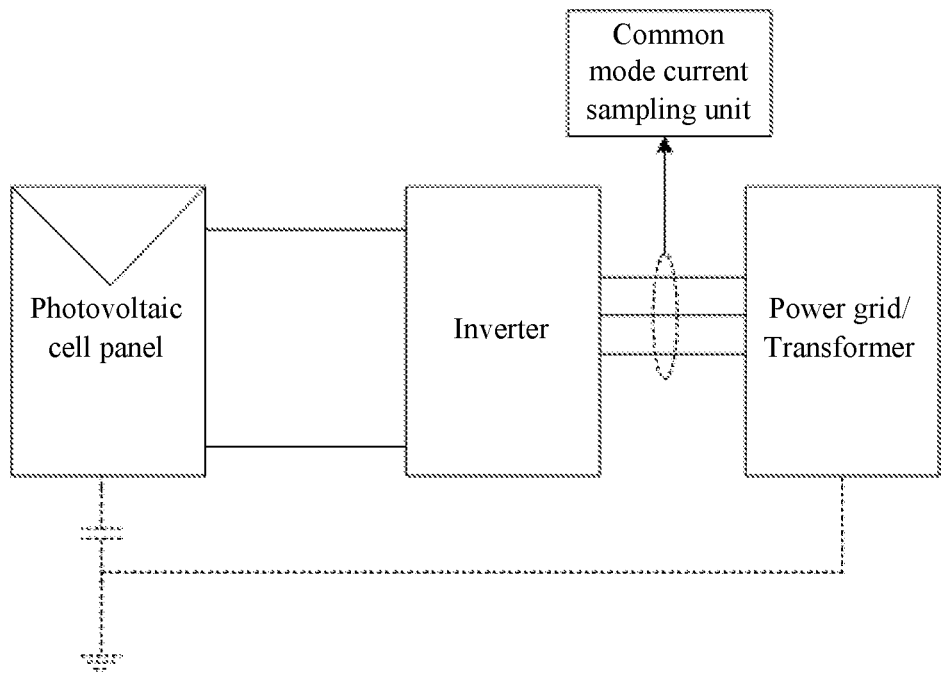
FIG. 7b is a schematic diagram in which a common mode current sampling unit is connected to an alternating current port side in an architecture according to an embodiment of the present disclosure.

The following describes an architecture used in an embodiment of the present disclosure. FIG. 6 is a schematic architectural diagram of a method for processing a direct current electric arc fault according to this embodiment of the present disclosure. In this method, two sampling units, namely, a direct current cable current sampling unit and a common mode current sampling unit, are used to obtain two different types of sampling currents. The direct current cable current sampling unit mainly samples a direct current cable current, and the common mode current sampling unit mainly samples data of a common mode current. The common mode current sampling unit may be connected to a direct current port side of an inverter to sample a direct current common mode current, or may be connected to an alternating current port side of the inverter to sample an alternating current common mode current. For details, refer to FIG. 7a and FIG. 7b. FIG. 7a is a schematic diagram in which the common mode current sampling unit is connected to the direct current port side in the architecture according to this embodiment of the present disclosure; and FIG. 7b is a schematic diagram in which the common mode current sampling unit is connected to the alternating current port side in the architecture according to this embodiment of the present disclosure. Then, an electric arc fault processing unit is used to calculate correlation between the direct current cable current and the common mode current. Finally, when it is found that the direct current cable current meets an electric arc occurrence condition, whether an alarm is required needs to be finally determined with reference to a correlation result.

In addition, due to impact from an operating environment, a direction, a covering, a grounding manner, and the like of a photovoltaic cell panel, the common mode current sampling unit cannot accurately obtain a specific numerical value of an actual common mode current. In this embodiment of the present disclosure, in one embodiment, a change trend of a common mode current sampling value is obtained to alleviate the impact.

The following analyzes the direct current cable current. Cases about whether an electric arc occurs are roughly classified into the following four types, as listed in Table 1.

TABLE 1

| Case | Differential mode noise | Common mode noise | Total noise (differential mode + common mode) | Actual status |
|---|---|---|---|---|
| 1 | Small | Small | Small | Normal operation |
| 2 | Small | Large | Large | Normal operation |
| 3 | Large | Small | Large | Electric arc occurs |
| 4 | Large | Large | Large | Electric arc occurs |

In the case 1, although common mode noise interference exists, because the total noise is relatively small, in a fault detection algorithm, a direct current electric arc fault determining condition is usually not triggered, and a false alarm is not likely to trigger.

In the case 2, the total noise is relatively large, and therefore a direct current electric arc fault determining condition is usually triggered, and a direct current electric arc alarm is generated. However, in this case, the differential mode noise is actually relatively small, and the system is actually in normal operation. Therefore, a false alarm is very likely to generate.

In the case 3, the total noise is relatively large, and the common mode noise is relatively small. Therefore, a direct current electric arc alarm is triggered, and a direct current electric arc fault is very likely to occur in the system, and therefore a false alarm probability is very low.

In the case 4, although the common mode noise is relatively large, the differential mode noise is also relatively large. Although the common mode noise may cause some interference, a direct current electric arc fault is certainly likely to occur in the circuit in this case, and therefore a false alarm probability is also relatively low.

It can be learned from the foregoing analysis that the false alarm probability is relatively high only in the case 2. Although interference exists in the other three cases, the false alarm probability is actually relatively low. Therefore, the high-probability false alarm problem in the case 2 needs to be resolved as a key point. In the case 2, it can be learned that a main noise component in the direct current cable current is the common mode noise, and the common mode noise is correlated with the common mode current in the photovoltaic power generation system in this case to some extent, and has a relatively similar change trend to the common mode current. Although a one-to-one correspondence cannot be obtained through accurate calculation, a linear correlation between the direct current cable current and the common mode current can be calculated by using a statistics method. In this case, the direct current cable current is highly correlated with the common mode current in the photovoltaic system, and therefore a correlation coefficient between the two types of currents is set to a determining condition in this embodiment of the present disclosure, to reduce the false alarm probability of the system. The following describes a method for processing a direct current electric arc according to an embodiment of the present disclosure.

Figure 8:
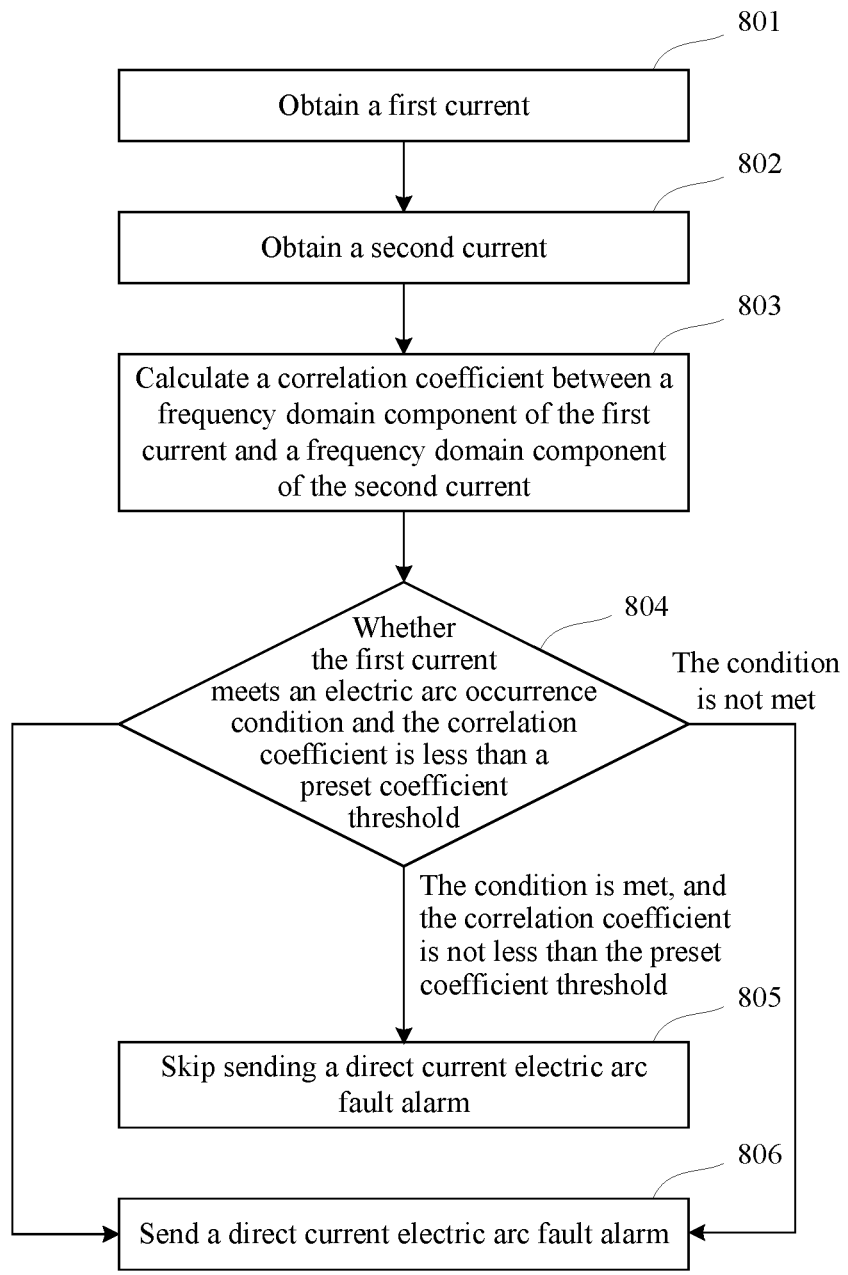
FIG. 8 is a diagram of an embodiment of a method for processing a direct current electric arc according to an embodiment of the present disclosure.

FIG. 8 is a diagram of an embodiment of a method for processing a direct current electric arc according to an embodiment of the present disclosure. In this embodiment of the present disclosure, the method may include the following operations.

Operation 801. Obtain a first current.

The first current is a current obtained from a direct current cable connected to a photovoltaic cell panel. The first current is a direct current input current, the direct current cable is used by the photovoltaic cell panel to output a direct current to an inverter, and the direct current input current is the direct current output by the photovoltaic cell panel to the inverter.

Operation 802. Obtain a second current.

The second current is a current obtained from a direct current cable on a direct current port side of the inverter or a current obtained from an alternating current cable on an alternating current port side of the inverter. The second current is a common mode current, and the alternating current cable is used by the inverter to output an alternating current. It can be understood that the second current is obtained in two manners. As shown in FIG. 7a and FIG. 7b, the second current is obtained from the direct current port side of the inverter in FIG. 7a, and the second current is obtained from the alternating current port side of the inverter in FIG. 7b. The second current obtained from the direct current port side is a direct current, and the second current obtained from the alternating current port side is an alternating current.

It should be noted that the first current in operation 801 and the second current in operation 802 are sampled in a continuous process, sampling may be performed once at an interval of a cycle, and different cycles may be of same duration or of different duration. The sampling may last for a preset time period, the preset time period includes at least one cycle, and data used to subsequently calculate a correlation coefficient is all data collected in the preset time period.

It should be noted that in operation 801 and operation 802, the current may be sampled from the direct current cable or the alternating current cable in a plurality of manners, but all the manners should follow a process of sampling, conditioning, and control. There are a plurality of types of sampling processes, for example:

Type 1: Sampling is performed by using a current transformer. To be specific, a cable from which a current is to be sampled is placed in a disposed coil, and according to the Electromagnetic Induction Law, the cable through which the detected current flows winds around the coil. The cable is used as a primary winding, and the measurement coil is used as a secondary winding. Specifically, the cable generates an electromagnetic field after being electrified, and therefore an induced current is generated in the coil. A current in the cable may be obtained in an intermediate conditioning operation in which some mathematical operations are performed on the induced current. For example, a preset correspondence between the induced current and an actual current is obtained through experiments, and then the current in the cable can be obtained based on the induced current during actual sampling. The common mode current sampling units in FIG. 7a and FIG. 7b use this manner.

Type 2: Sampling is performed in a small-resistance non-conductive manner. To be specific, a small-resistance resistor is connected to a current return circuit in series, a voltage difference between two ends of the small-resistance resistor is measured, and according to the Ohm's law, a voltage is divided by a resistance to obtain a detected current. It should be noted that in this method, for selection of a resistance value of the sampling resistor, power needs to be large enough, and an inductance of the resistor needs to be small, to eliminate a voltage drop caused by inductive reactance on the two ends of the resistor.

Type 3: Sampling is performed by using a Hall current sensor. In this manner, sampling is mainly performed based on the Hall effect. When a current is perpendicular to an external magnetic field and flows through a conductor, a current carrier deflects, and an additional electric field may be generated in a direction perpendicular to the current and the magnetic field, and therefore an electric potential difference is generated between two ends of the conductor. This is the Hall effect, and the electric potential difference is also referred to as the Hall electric potential difference.

The conditioning operation needs to be added between the sampling operation and the control operation to compensate for and correct a measured result. This is because high-frequency noise usually occurs in a mathematical signal that is obtained in the sampling operation and that is related to a detected current signal, and an amplitude of the mathematical signal is larger or smaller than a signal required in the control operation. A filter, an operational amplifier, and the like are commonly used in the conditioning operation.

Finally, the control operation is a operation in which the method for processing a direct current electric arc according to this embodiment of the present disclosure is performed. Control can be performed only after a conditioned current value is obtained.

Operation 803. Calculate a correlation coefficient between a frequency domain component of the first current and a frequency domain component of the second current.

The frequency domain component is a frequency value of a current within a preset frequency band in frequency domain. Because a direct current electric arc pre-alarm is mainly researched in the present disclosure, the frequency domain component in this embodiment of the present disclosure is in a frequency band in which a high-frequency current exists when an electric arc occurs, for example, between 30 kHz and 80 kHz. In addition, regardless of a direct current or an alternating current, any current that can generate an electric arc can generate a frequency domain component, and any current corresponding to the electric arc is presented in a high-frequency and unstable manner. For the direct current, a changing amplitude of the direct current is simulated to a high-frequency component in a manner such as Fourier expansion. The alternating current is represented as an alternating current with a non-sinusoidal cycle. In addition, the correlation coefficient is a statistical indicator designed by a famous statistician Karl Pearson. Compared with a correlation table and a correlation diagram that can reflect only a correlation and a correlation direction between two variables but cannot exactly show a degree of correlation between the two variables, the correlation coefficient is a statistical indicator used to reflect a degree of correlation between variables. The correlation coefficient is calculated by using a product-moment method. Based on dispersions between two variables and respective average values, the two dispersions are multiplied to reflect a degree of correlation between the two variables. A linear single-correlation coefficient is researched as a key point.

It should be noted that a correlation is a nondeterministic relationship, and a correlation coefficient is a quantity used to research a degree of linear correlation between variables. Due to different research objects, the correlation coefficient may be defined in the following several manners:

1. Simple correlation coefficient. The simple correlation coefficient is also referred to as a correlation coefficient or a linear correlation coefficient, is generally represented by a letter P, and is a quantity used to measure a linear relationship between variables.

2. Multiple correlation coefficient. The multiple correlation coefficient is also referred to as a multi-correlation coefficient. A multiple correlation is a correlation between a plurality of independent variables. For example, a seasonal demand of a kind of commodity is in a multiple correlation with a price level of the commodity, an income level of employees, and the like.

3. Canonical correlation coefficient. A principal component analysis is first performed on each group of original variables, to obtain comprehensive indicators of a new linear relationship, and a linear correlation coefficient between the comprehensive indicators is used to research a correlation between each group of original variables.

The correlation coefficient in this embodiment of the present disclosure is mainly implemented in the last two manners.

Figure 9:
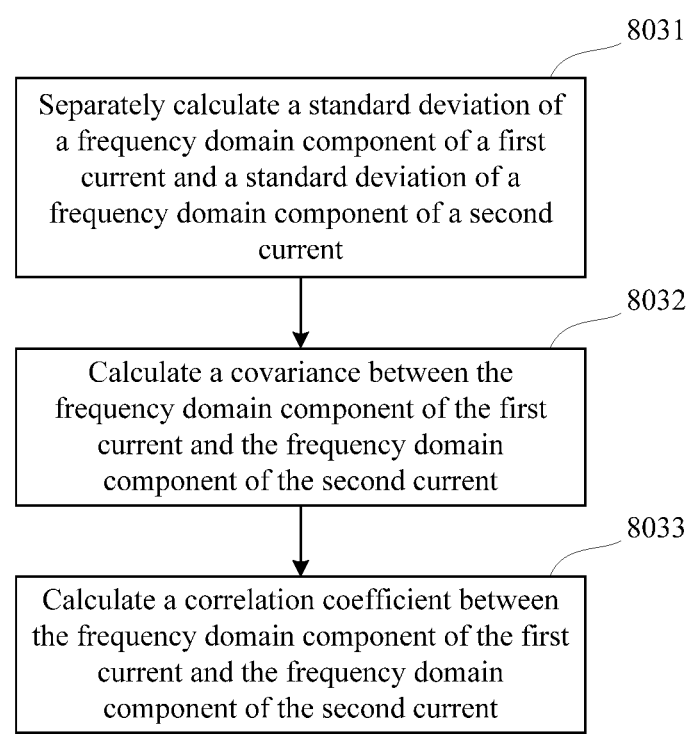
FIG. 9 is a schematic diagram of a correlation coefficient calculation method in a method for processing a direct current electric arc according to an embodiment of the present disclosure.

In this embodiment, after the first current and the second current are obtained, the correlation coefficient between the frequency domain component of the first current and the frequency domain component of the second current may be calculated. For details about calculating the correlation coefficient between the frequency domain component of the first current and the frequency domain component of the second current, refer to FIG. 9. FIG. 9 is a schematic diagram of a correlation coefficient calculation method in the method for processing a direct current electric arc according to this embodiment of the present disclosure. Operation 803 may include the following sub-operations:

Operation 8031. Separately calculate a standard deviation of the frequency domain component of the first current and a standard deviation of the frequency domain component of the second current.

For a plurality of collected first currents, a standard deviation of a frequency domain component of one of the collected first currents is calculated. Specifically, the standard deviation $s_x$ of the frequency domain component of the first current x may be calculated by using the following formula (1):

$$s_x = \sqrt{\frac{\sum (x_i - \bar{x})^2}{n-1}} \quad (1)$$

where n is a quantity of sampling times of the frequency domain component of the first current, and $x_i$ is a value of the first current x sampled in an $i^{th}$ cycle.

Then, for a plurality of collected second currents, the standard deviation $s_y$ of the frequency domain component of the second current y is calculated by using the following formula (2):

$$s_y = \sqrt{\frac{\sum (y - \bar{y})^2}{n-1}} \quad (2)$$

where n is a quantity of sampling times of the frequency domain component of the second current, and $y_i$ is a value of the second current y sampled in an $i^{th}$ cycle. It can be learned that the quantity of data sampling times of the first current x is consistent with the quantity of data sampling times of the second current y, and both are n.

Operation 8032. Calculate a covariance between the frequency domain component of the first current and the frequency domain component of the second current.

After the standard deviation of the first current x and the standard deviation of the second current y are calculated in operation 8031, the covariance $s_{xy}$ between the first current x and the second current y may be calculated by using the following formula (3):

$$s_{xy} = \frac{\sum (x_i - \bar{x})(y_i - \bar{y})}{n-1} \quad (3)$$

Operation 8033. Calculate the correlation coefficient between the frequency domain component of the first current and the frequency domain component of the second current.

After the covariance $s_{xy}$ is calculated, the correlation coefficient $r_{xy}$ between the frequency domain component of the first current and the frequency domain component of the second current may be calculated by using the following formula (4):

$$r_{xy} = \frac{s_{xy}}{s_x s_y} \quad (4)$$

It can be learned that the correlation coefficient $r_{xy}$ is actually a ratio of the covariance $s_{xy}$ to a product of the standard deviation $s_x$ of the first current x and the standard deviation $s_y$ of the second current y. The ratio can reflect a proportion of common mode noise generated by the second current in total noise. Therefore, the ratio can be used as a basis to determine whether a current case is the case 2 in Table 1. The total noise is obtained by adding up the common mode noise generated by the second current and differential mode noise of a photovoltaic system.

Operation 804. Determine whether the first current meets an electric arc occurrence condition and whether the correlation coefficient is less than a preset coefficient threshold, and perform operation 805 when the first current meets the electric arc occurrence condition and the correlation coefficient is greater than or equal to the preset coefficient threshold.

Figure 10:
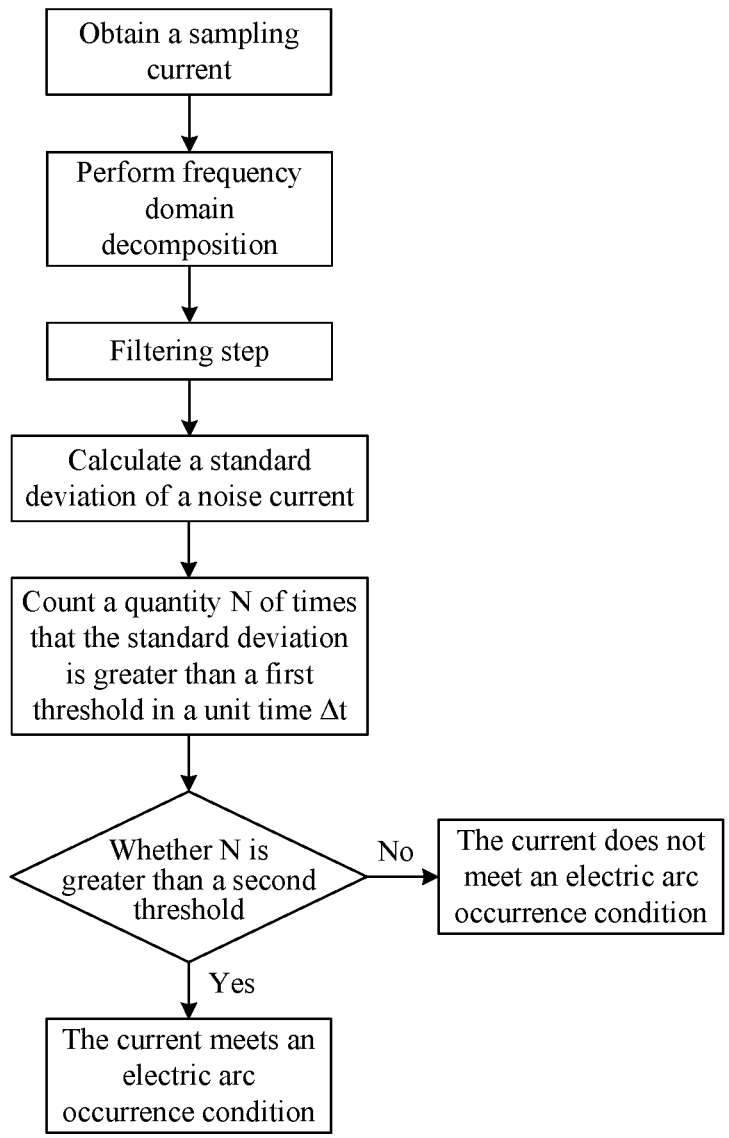
FIG. 10 is a schematic diagram of a method for determining whether a current meets an electric arc occurrence condition in a method for processing a direct current electric arc according to an embodiment of the present disclosure.

The following describes the determining whether the first current meets an electric arc occurrence condition. FIG. 10 is a schematic diagram of a method for determining whether a current meets an electric arc occurrence condition in the method for processing a direct current electric arc according to this embodiment of the present disclosure. First, the to-be-determined first current or second current is obtained. The first current is used as an example. Then, frequency domain decomposition is performed on the first current, and a specific frequency band is selected in a filtering manner, for example, a range from 30 kHz to 80 kHz is selected. This range is selected mainly because this range is a frequency band in which main electric arc current noise occurs. After the selection is completed, the standard deviation of the first current is calculated, and then the standard deviation is compared with a standard deviation threshold (namely, a first threshold). If the standard deviation is greater than the standard deviation threshold, a count is increased by 1, and one standard deviation calculation process is completed. A quantity N of times that the standard deviation of the selected first current is greater than the standard deviation threshold in a period of time is counted. Finally, determining is performed on the calculated N and a second threshold, and when N is greater than the second threshold, it indicates that the first current meets the electric arc occurrence condition, or when N is not greater than the second threshold, it indicates that the first current does not meet the electric arc occurrence condition.

Figure 11:
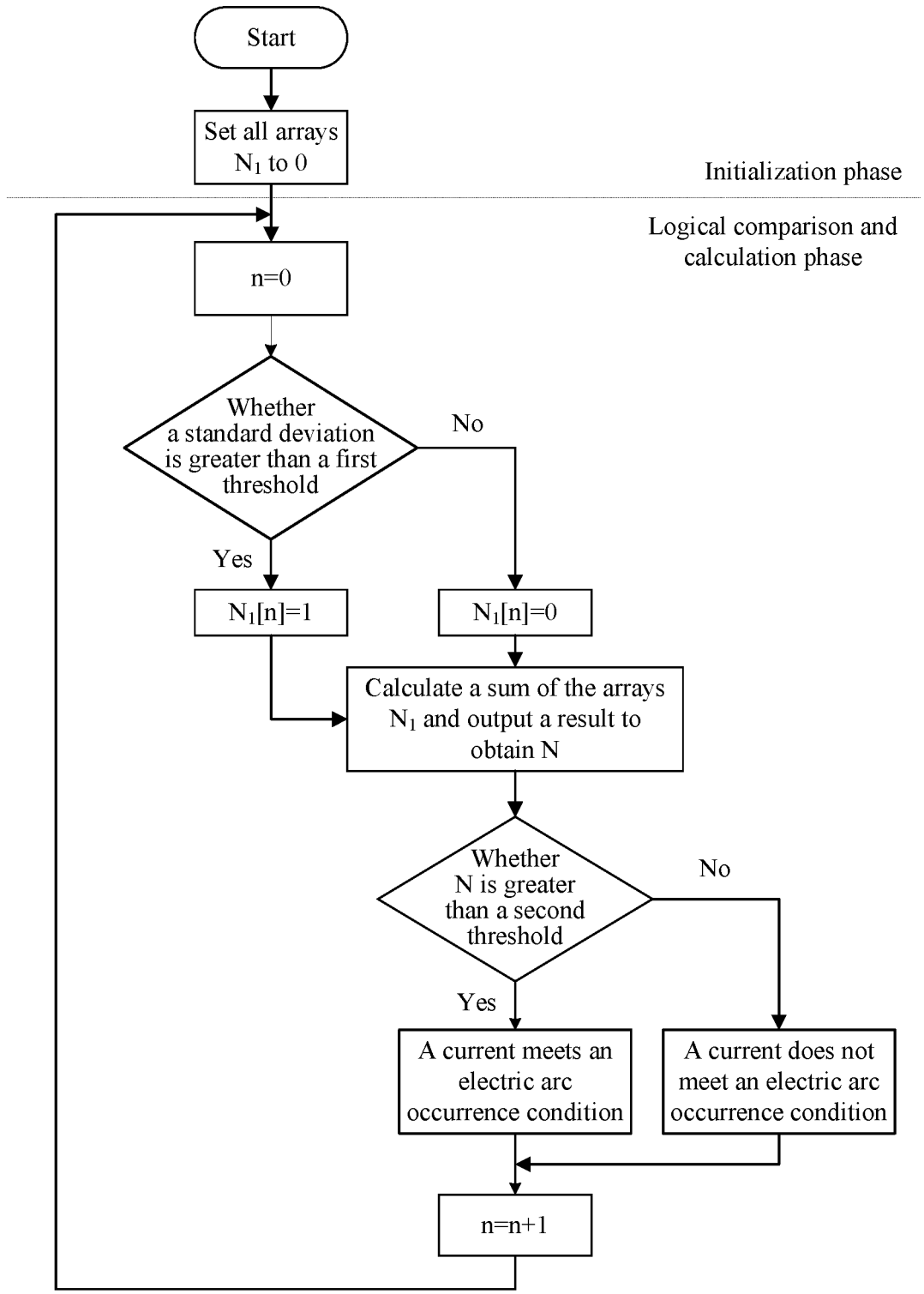
FIG. 11 is a schematic flowchart of a sliding window in a method for processing a direct current electric arc according to an embodiment of the present disclosure.

Specifically, the quantity N of times that the standard deviation of the selected first current is greater than the standard deviation threshold in the period of time may be counted in the following manner: obtaining, through counting of a sliding window, the quantity N of times that the standard deviation is greater than the first threshold in the preset time period. FIG. 11 is a schematic flowchart of a sliding window in the method for processing a direct current electric arc according to this embodiment of the present disclosure. A specific implementation of this sliding window technology includes two phases: an initialization phase and a logical comparison and calculation phase. In the initialization phase, all arrays $N_1$ are set to 0. Then, in the logical comparison and calculation phase, n is set to 0. First, whether the standard deviation is greater than the first threshold is determined, and $N_1[n]=1$ if the standard deviation is greater than the first threshold, or $N_1[n]=0$ if the standard deviation is not greater than the first threshold. After the determining is completed, a sum of the arrays $N_1$ is calculated and a result is output to obtain N. Then, N may be compared with the second threshold, and if N is greater than the second threshold, it indicates that the current meets the electric arc occurrence condition, or if N is not greater than the second threshold, it indicates that the current does not meet the electric arc occurrence condition. This process is one electric arc occurrence condition determining process in one time period. After this process is completed, n is increased by 1, and an electric arc occurrence condition determining process in a next time period starts.

Operation 805. Skip sending a direct current electric arc fault alarm.

It can be learned that, it can be determined that an alarm is still not required in some cases when the first current meets the electric arc occurrence condition. Although total current noise is relatively large, differential mode noise is actually relatively small, and common mode noise is relatively large. Because the common mode noise actually affects a circuit very slightly, the circuit is in a normal operation state. In this embodiment of the present disclosure, the calculated correlation coefficient between the frequency domain component of the first current and the frequency domain component of the second current is used to reflect a proportion of common mode noise generated by the second current, and the preset coefficient threshold is set. If the correlation coefficient is greater than the coefficient threshold, it indicates that the first current meets the electric arc occurrence condition because the common mode noise is relatively large. In this case, no alarm needs to be sent. Therefore, in this embodiment of the present disclosure, a direct current electric arc fault alarm is not sent when it is found that the first current meets the electric arc occurrence condition and the correlation coefficient is greater than or equal to the preset threshold.

In one embodiment, the method may further include the following operation:

Operation 806. Send a direct current electric arc fault alarm.

In one embodiment, operation 804 may further include the following sub-operation. For example, when the first current meets the electric arc occurrence condition and the correlation coefficient is less than the preset coefficient threshold, operation 806 is performed. Certainly, when the first current does not meet the electric arc occurrence condition, operation 805 is performed regardless of whether the correlation coefficient is less than the preset coefficient threshold.

It should be noted that there is no specific order between the direct current electric arc occurrence condition determining operation and the correlation coefficient calculation operation. The following separately describes two cases with reference to two common mode current sampling manners.

Figure 12:
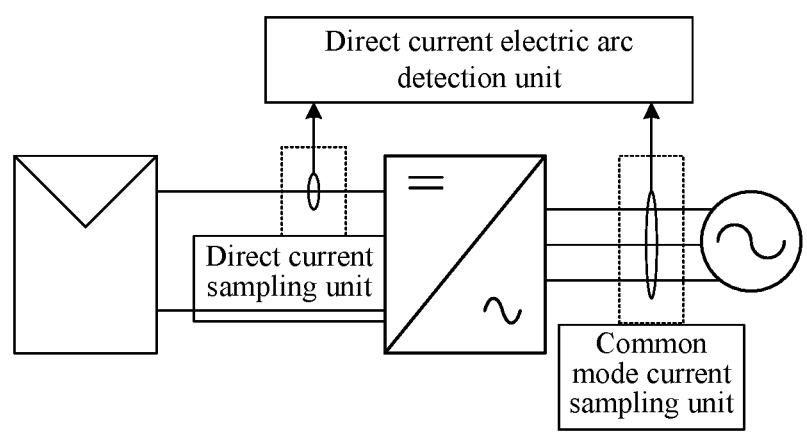
FIG. 12 is a schematic architectural diagram of a system for processing a direct current electric arc according to an embodiment of the present disclosure.
Figure 13:
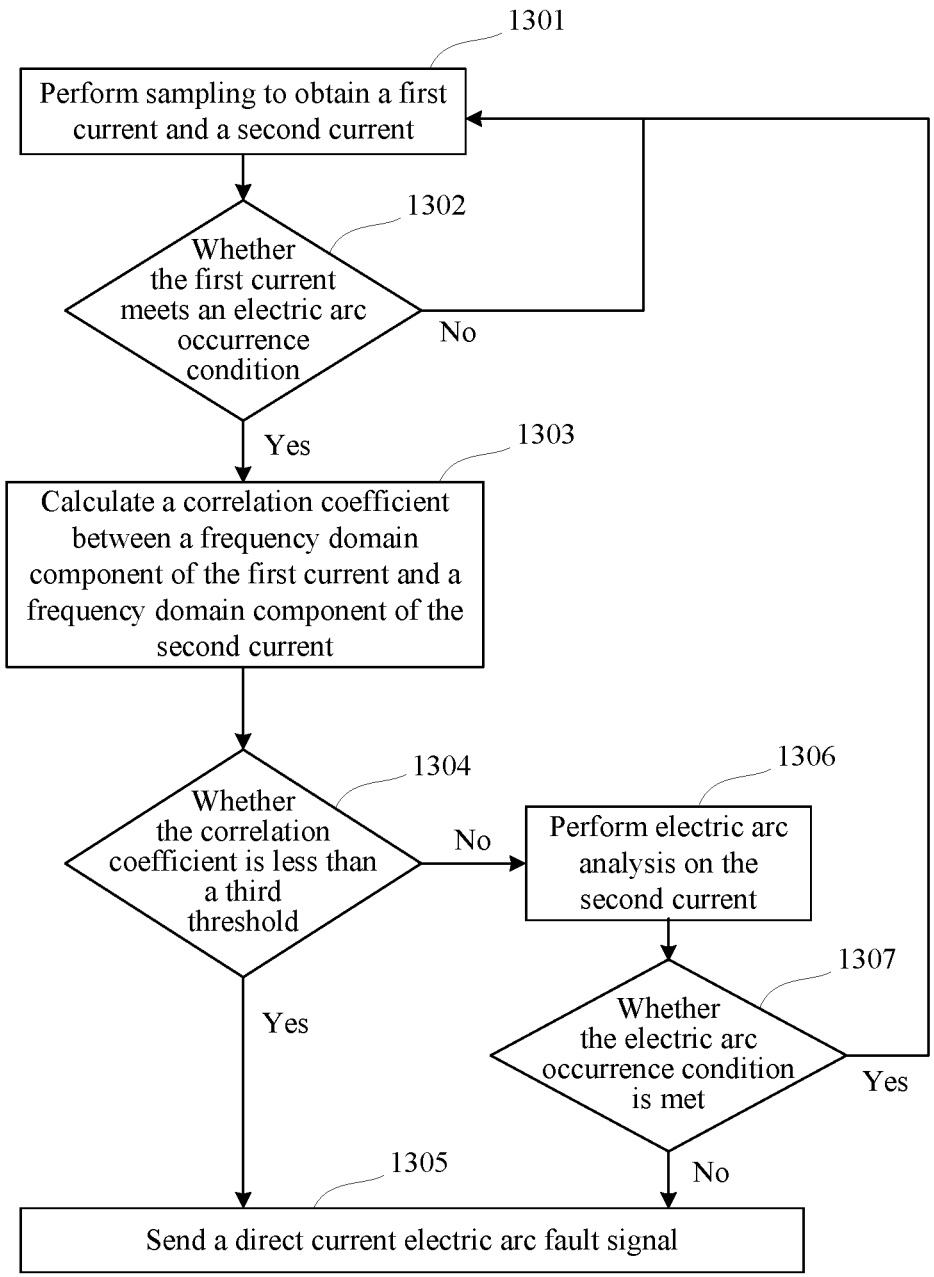
FIG. 13 is a diagram of an embodiment of a method for processing a direct current electric arc according to an embodiment of the present disclosure.

Case 1: The second current on the alternating current port side of the inverter is sampled as a common mode current. First, whether the first current meets the electric arc occurrence condition is reached, and then the correlation coefficient between the first current and the second current is calculated. FIG. 12 is a schematic architectural diagram of a system for processing a direct current electric arc according to an embodiment of the present disclosure, and FIG. 13 is a diagram of an embodiment of a method for processing a direct current electric arc according to this embodiment of the present disclosure. A current transform manner is used in FIG. 12 and FIG. 13. In FIG. 12, all alternating current cables run through a second coil of a common mode current sampling unit, and a positive bus bar or a negative bus bar runs through a first coil of a direct current sampling unit. As shown in FIG. 13, the method includes the following operations.

Operation 1301. Perform sampling on a direct current cable to obtain a first current, and perform sampling on an alternating current cable of an inverter to obtain a second current.

For the sampling process, refer to operation 801 and operation 802 in the embodiment shown in FIG. 8. Details are not described herein again.

Operation 1302. Determine whether the first current meets an electric arc occurrence condition, and perform operation 1303 if the first current meets the electric arc occurrence condition, or perform operation 1301 if the first current does not meet the electric arc occurrence condition.

For whether the first current meets the electric arc occurrence condition, refer to the description of operation 804 in the embodiment shown in FIG. 8. Details are not described herein again.

Operation 1303. Calculate a correlation coefficient between a frequency domain component of the first current and a frequency domain component of the second current.

For the correlation coefficient between the frequency domain component of the first current and the frequency domain component of the second current, refer to the description of operation 803 in the embodiment shown in FIG. 8. Details are not described herein again.

Operation 1304. Determine whether the correlation coefficient is less than a preset coefficient threshold, and perform operation 1305 if the correlation coefficient is less than the preset coefficient threshold, or perform operation 1306 if the correlation coefficient is not less than the preset coefficient threshold.

For the correlation coefficient, refer to the description of operation 803 in the embodiment shown in FIG. 8. Details are not described herein again.

Operation 1305. Send a direct current electric arc fault signal.

Operation 1306. Perform electric arc analysis on the second current.

For the electric arc analysis process, refer to the description of operation 804 in the embodiment shown in FIG. 8. Details are not described herein again.

Operation 1307. Determine whether the second current meets the electric arc occurrence condition, and perform operation 1301 if the second current meets the electric arc occurrence condition, or perform operation 1305 if the second current does not meet the electric arc occurrence condition.

In this manner, when it is found that the first current meets the electric arc occurrence condition and the correlation coefficient is not less than the preset coefficient threshold, it is considered that a common mode current component in the direct current cable current is relatively large. An erroneous determining probability is relatively high when determining is performed based only on whether the direct current cable current meets the electric arc occurrence condition. In this case, whether the second current meets the electric arc occurrence condition is further determined. If the second current meets the electric arc occurrence condition, it is considered that the direct current cable current meets the electric arc occurrence condition because the common mode component is relatively large, and therefore no alarm is sent, and operation 1301 is performed. If the second current does not meet the electric arc occurrence condition, to reduce detection coverage holes, operation 1305 is performed to send a direct current electric arc fault alarm.

Figure 14:
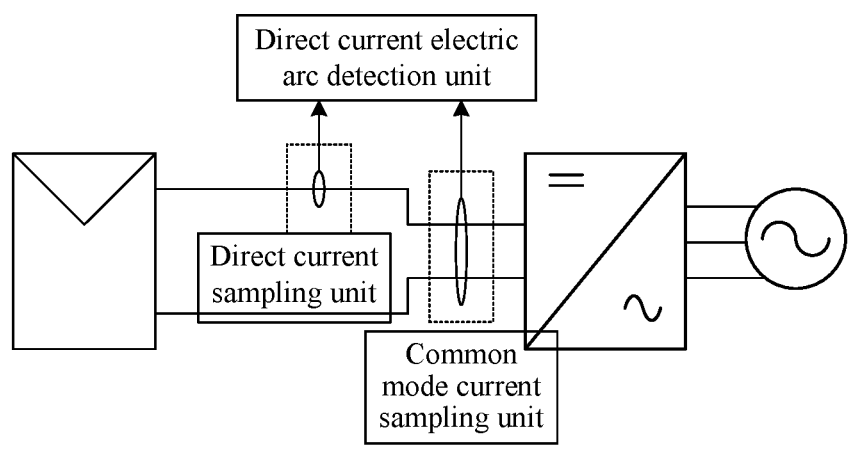
FIG. 14 is a schematic architectural diagram of a system for processing a direct current electric arc according to an embodiment of the present disclosure.
Figure 15:
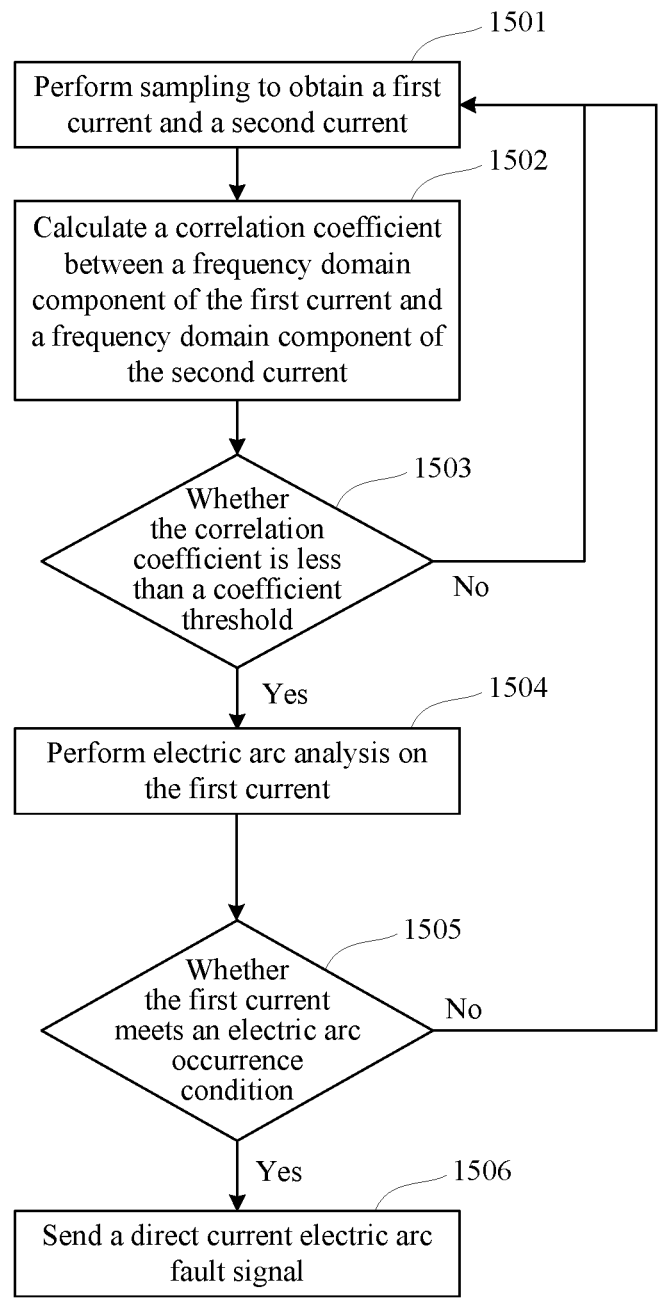
FIG. 15 is a diagram of an embodiment of a method for processing a direct current electric arc according to an embodiment of the present disclosure.

Case 2: The second current on the direct current port side of the inverter is sampled as a common mode current. First, the correlation coefficient between the first current and the second current is calculated, and then whether the first current meets the electric arc occurrence condition is calculated. FIG. 14 is a schematic architectural diagram of a system for processing a direct current electric arc according to an embodiment of the present disclosure, and FIG. 15 is a diagram of an embodiment of a method for processing a direct current electric arc according to this embodiment of the present disclosure. In FIG. 14, a positive bus bar or a negative bus bar runs through a first coil of a direct current sampling unit, and a positive bus bar or a negative bus bar runs through a second coil of a common mode current sampling unit. As shown in FIG. 15, the method includes the following operations.

Operation 1501. Perform sampling on a direct current cable to obtain a first current, and perform sampling on alternating direct current cable of an inverter to obtain a second current.

For the sampling process, refer to operation 801 and operation 802 in the embodiment shown in FIG. 8. Details are not described herein again.

Operation 1502. Calculate a correlation coefficient between a frequency domain component of the first current and a frequency domain component of the second current.

For the correlation coefficient between the frequency domain component of the first current and the frequency domain component of the second current, refer to the description of operation 803 in the embodiment shown in FIG. 8. Details are not described herein again.

Operation 1503. Determine whether the correlation coefficient is less than a preset coefficient threshold, and perform operation 1504 if the correlation coefficient is less than the preset coefficient threshold, or perform operation 1501 if the correlation coefficient is not less than the preset coefficient threshold.

For the correlation coefficient, refer to the description of operation 803 in the embodiment shown in FIG. 8. Details are not described herein again.

Operation 1504. Perform electric arc analysis on the first current.

For the electric arc analysis process, refer to the description of operation 804 in the embodiment shown in FIG. 8. Details are not described herein again.

Operation 1505. Determine whether the first current meets an electric arc occurrence condition, and perform operation 1506 if the first current meets the electric arc occurrence condition, or perform operation 1501 if the first current does not meet the electric arc occurrence condition.

For the electric arc analysis process, refer to the description of operation 804 in the embodiment shown in FIG. 8. Details are not described herein again.

Operation 1506. Send a direct current electric arc fault signal.

The present disclosure is based on a statistics method. The correlation coefficient between the direct current cable current and the common mode current is used as a basis for determining. This can avoid an error caused by different working conditions to an accurate numerical value-based calculation method, and can suppress a false alarm caused by the common mode current on a direct current electric arc fault of the photovoltaic inverter, thereby improving accuracy of direct current electric arc fault detection, reducing interference on normal operation of the inverter, and improving product performance.

In addition, the direct current cable current and the common mode current that are used to calculate the correlation coefficient can be sampled synchronously, and are both sampling results under a same working condition. Therefore, impact of a working condition change of a photovoltaic power generation system on a detection result can be alleviated.

In addition, the embodiments of the present disclosure are applicable to a three-phase inverter product, a single-phase inverter product, a string inverter product, and a centralized inverter product, and therefore have a wide coverage scope.

All or some of the foregoing embodiments may be implemented by using software, hardware, firmware, or any combination thereof. When software is used to implement the embodiments, the embodiments may be implemented completely or partially in a form of a computer program product.

It may be clearly understood by persons skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present disclosure, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electrical, mechanical, or other forms.

The units described as separate parts may or may not be physically separate, and parts displayed as units may or may not be physical units, to be specific, may be located in one place, or may be distributed on a plurality of network units. Some or all of the units may be selected based on actual requirements to achieve the objectives of the solutions of the embodiments.

In addition, functional units in the embodiments of the present disclosure may be integrated into one processing unit, or each of the units may exist alone physically, or two or more units are integrated into one unit. The integrated unit may be implemented in a form of hardware, or may be implemented in a form of a software functional unit.

The foregoing embodiments are merely intended for describing the technical solutions of the present disclosure, but not for limiting the present disclosure. Although the present disclosure is described in detail with reference to the foregoing embodiments, persons skilled in the art should understand that they may still make modifications to the technical solutions recorded in the foregoing embodiments or make equivalent replacements to some technical features thereof, without departing from the technical solutions and scope of the embodiments of the present disclosure.

What is claimed is:

1. A method for processing a direct current electric arc, applied to a photovoltaic cell system, comprising:
    obtaining a first current (x), wherein the first current is a direct current input current of a direct current cable connected to a photovoltaic cell panel of the photovoltaic cell system;
    obtaining a second current (y), wherein the second current is a direct current common mode current of a direct current cable on a direct current port side of an inverter of the photovoltaic cell system or an alternating current common mode current of an alternating current cable on an alternating current port side of the inverter;
    obtaining a correlation coefficient ($r_{xy}$) between a frequency domain component of the first current and a frequency domain component of the second current, wherein the frequency domain component is a frequency value of a current within a preset frequency band in frequency domain, and the correlation coefficient reflects a degree of correlation between the frequency domain component of the first current and the frequency domain component of the second current; and
    when determining that the first current meets an electric arc occurrence condition and the correlation coefficient is greater than or equal to a preset coefficient threshold, skipping sending a direct current electric arc fault alarm, wherein the determining that the first current meets an electric arc occurrence condition comprises:
    performing frequency domain decomposition on the first current to obtain a first frequency range, wherein the first frequency range is a frequency band in which electric arc noise occurs;
    calculating a standard deviation of a current frequency value in the first frequency range; and
    obtaining a quantity N of times that the standard deviation is greater than a first threshold in a preset time period, and when N is greater than a second threshold, determining that the first current meets the electric arc occurrence condition, wherein N is an integer that is greater than or equal to 0.

2. The method according to claim 1, wherein the calculating a correlation coefficient between a frequency domain component of the first current and a frequency domain component of the second current comprises:
    separately calculating a standard deviation ($s_x$) of the frequency domain component of the first current and a standard deviation ($s_y$) of the frequency domain component of the second current;
    calculating a covariance ($s_{xy}$) between the frequency domain component of the first current and the frequency domain component of the second current; and
    calculating the correlation coefficient between the frequency domain component of the first current and the frequency domain component of the second current based on the standard deviations $s_x$ and $s_y$ and the covariance.

3. The method according to claim 2, wherein the standard deviation $s_x$ of the frequency domain component of the first current x is calculated by using the following formula:

$$s_x = \sqrt{\frac{\sum (x_i - \bar{x})^2}{n-1}},$$

wherein n is a quantity of sampling times of the frequency domain component of the first current;

the standard deviation $s_y$ of the frequency domain component of the second current y is calculated by using the following formula:

$$s_y = \sqrt{\frac{\sum (y - \bar{y})^2}{n-1}},$$

wherein n is a quantity of sampling times of the frequency domain component of the second current;

the covariance $s_{xy}$ between the frequency domain component of the first current and the frequency domain component of the second current is calculated by using the following formula:

$$s_{xy} = \frac{\sum (x_i - \bar{x})(y_i - \bar{y})}{n-1};$$

and the correlation coefficient $r_{xy}$ between the frequency domain component of the first current and the frequency domain component of the second current is calculated by using the following formula:

$$r_{xy} = \frac{s_{xy}}{s_x s_y}.$$

4. The method according to claim 1, wherein the obtaining a quantity N of times that the standard deviation is greater than a first threshold in a preset time period comprises:
    obtaining, through counting of a sliding window, the quantity N of times that the standard deviation is greater than the first threshold in the preset time period.

5. The method according to claim 1, wherein the method further comprises:
when determining that the first current meets the electric arc occurrence condition and the correlation coefficient is less than the preset coefficient threshold, sending a direct current electric arc fault alarm.

6. The method according to claim 1, wherein the first current is a current obtained by performing sampling on a positive bus bar or a negative bus bar of the direct current cable, and the second current is a current obtained by performing sampling on all alternating current cables on the alternating current port side of the inverter.

7. The method according to claim 6, wherein before the obtaining a correlation coefficient between a frequency domain component of the first current and a frequency domain component of the second current, the method further comprises:
performing electric arc analysis on the first current; and
when the first current meets the electric arc occurrence condition, performing the calculating a correlation coefficient.

8. The method according to claim 6, wherein the method further comprises:
when determining that the first current meets the electric arc occurrence condition, the correlation coefficient is greater than or equal to the preset coefficient threshold, and the second current meets the electric arc occurrence condition, skipping sending a direct current electric arc fault alarm.

9. The method according to claim 6, wherein the method further comprises:
when determining that the first current meets the electric arc occurrence condition, the correlation coefficient is greater than or equal to the preset coefficient threshold, and the second current does not meet the electric arc occurrence condition, sending a direct current electric arc fault alarm.

10. The method according to claim 1, wherein the first current is a current obtained by performing sampling on a positive bus bar or a negative bus bar of the direct current cable, and the second current is a current obtained by performing sampling on all direct current cables on the direct current port side of the inverter.

11. The method according to claim 10, wherein after the calculating a correlation coefficient between a frequency domain component of the first current and a frequency domain component of the second current, the method further comprises:
when determining that the correlation coefficient is less than the preset coefficient threshold, performing electric arc analysis on the first current.

12. An apparatus for detecting a direct current electric arc, comprising an electric arc fault processing module, and a first sampling module and a second sampling module that are connected to the processing module, wherein
the first sampling module is disposed on a detected direct current cable connected to a photovoltaic cell panel of a photovoltaic cell system, and is configured to perform sampling on the direct current cable, to obtain a first current (x); and the second sampling module is disposed on a direct current cable on a direct current port side of an inverter of the photovoltaic cell system or on an alternating current cable on an alternating current port side of the inverter, and is configured to perform sampling on the direct current cable on the direct current port side of the inverter or the alternating current cable on the alternating current port side of the inverter, to obtain a second current (y);
after receiving the first current and the second current, the electric arc fault processing module obtains a frequency domain component of the first current based on the first current, and is further configured to: obtain a frequency domain component of the second current based on the second current, and calculate a correlation coefficient ($r_{xy}$) between the frequency domain component of the first current and the frequency domain component of the second current, wherein the frequency domain component is a frequency value of a current within a preset frequency band in frequency domain, and the correlation coefficient reflects a degree of correlation between the frequency domain component of the first current and the frequency domain component of the second current; and
when the electric arc fault processing module determines that the first current meets an electric arc occurrence condition and the correlation coefficient is greater than or equal to a preset coefficient threshold, the electric arc fault processing module does not send a direct current electric arc fault alarm, wherein that the electric arc fault processing module determines that the first current meets an electric arc occurrence condition comprises:
performing frequency domain decomposition on the first current to obtain a first frequency range, wherein the first frequency range is a frequency band in which electric arc noise occurs;
calculating a standard deviation of a current frequency value in the first frequency range; and
obtaining a quantity N of times that the standard deviation is greater than a first threshold in a preset time period, and when N is greater than a second threshold, determining that the first current meets the electric arc occurrence condition, wherein N is an integer that is greater than or equal to 0.

13. The apparatus according to claim 12, wherein the first sampling module is a direct current cable current sampling module, and the direct current cable current sampling module performs sampling on a positive bus bar or a negative bus bar of the direct current cable, to obtain a direct current input current; and the second sampling module is a common mode current sampling module, and when the common mode current sampling module is disposed on the direct current cable on the direct current port side of the inverter, the common mode current sampling module performs sampling on all direct current cables, to obtain a direct current common mode current, or when the common mode current sampling module is disposed on the alternating current cable on the alternating current port side of the inverter, the common mode current sampling module performs sampling on all alternating current cables, to obtain an alternating current common mode current.

14. The apparatus according to claim 13, wherein the direct current cable current sampling module comprises a first sampling coil and a first sampling control unit, the positive bus bar or the negative bus bar of the direct current cable runs through the first sampling coil, and the first sampling control unit is configured to convert a current sampled by the first sampling coil into the direct current input current.

15. The apparatus according to claim 13, wherein the common mode current sampling module comprises a second sampling coil and a second sampling control unit, and when the common mode current sampling module performs sampling on the direct current cables, all the direct current cables run through the second sampling coil, or when the common mode current sampling module performs sampling on the alternating current cables, all the alternating current cables run through the second sampling coil.

16. The apparatus according to claim 12, wherein the obtaining, by the electric arc fault processing module, a quantity N of times that the standard deviation is greater than a first threshold in a preset time period comprises:
   obtaining, through counting of a sliding window, the quantity N of times that the standard deviation is greater than the first threshold in the preset time period.

17. The apparatus according to claim 12, wherein the calculating, by the electric arc fault processing module, a correlation coefficient between the frequency domain component of the first current and the frequency domain component of the second current comprises:
   separately calculating a standard deviation ($s_x$) of the frequency domain component of the first current and a standard deviation ($s_y$) of the frequency domain component of the second current;
   calculating a covariance ($s_{xy}$) between the frequency domain component of the first current and the frequency domain component of the second current; and
   calculating the correlation coefficient based on the standard deviations $s_x$ and $s_y$ and the covariance.

18. The apparatus according to claim 17, wherein the standard deviation $s_x$ of the frequency domain component of the first current x is calculated by using the following formula:

$$s_x = \sqrt{\frac{\sum(x_i - \bar{x})^2}{n-1}},$$

wherein n is a quantity of sampling times of the frequency domain component of the first current;
   the standard deviation $s_y$ of the frequency domain component of the second current y is calculated by using the following formula:

$$s_y = \sqrt{\frac{\sum(y - \bar{y})^2}{n-1}}$$

wherein n is a quantity of sampling times of the frequency domain component of the second current;
   the covariance $s_{xy}$ between the frequency domain component of the first current and the frequency domain component of the second current is calculated by using the following formula:

$$s_{xy} = \frac{\sum(x_i - \bar{x})(y_i - \bar{y})}{n-1};$$

and
   the correlation coefficient $r_{xy}$ is calculated by using the following formula:

$$r_{xy} = \frac{s_{xy}}{s_x s_y}.$$

19. A method for processing a direct current electric arc, applied to a photovoltaic cell system, comprising:
   obtaining a first current (x), wherein the first current is a direct current input current of a direct current cable connected to a photovoltaic cell panel of the photovoltaic cell system;
   obtaining a second current (y), wherein the second current is a direct current common mode current of a direct current cable on a direct current port side of an inverter of the photovoltaic cell system or an alternating current common mode current of an alternating current cable on an alternating current port side of the inverter;
   obtaining a correlation coefficient ($r_{xy}$) between a frequency domain component of the first current and a frequency domain component of the second current, wherein the frequency domain component is a frequency value of a current within a preset frequency band in frequency domain, and the correlation coefficient reflects a degree of correlation between the frequency domain component of the first current and the frequency domain component of the second current; and
   when determining that the first current meets an electric arc occurrence condition and the correlation coefficient is greater than or equal to a preset coefficient threshold, skipping sending a direct current electric arc fault alarm, wherein the calculating a correlation coefficient between a frequency domain component of the first current and a frequency domain component of the second current comprises:
   separately calculating a standard deviation ($s_x$) of the frequency domain component of the first current and a standard deviation ($s_y$) of the frequency domain component of the second current;
   calculating a covariance ($s_{xy}$) between the frequency domain component of the first current and the frequency domain component of the second current; and
   calculating the correlation coefficient between the frequency domain component of the first current and the frequency domain component of the second current based on the standard deviations and the covariance.

20. The method according to claim 19, wherein the standard deviation $s_x$ of the frequency domain component of the first current x is calculated by using the following formula:

$$s_x = \sqrt{\frac{\sum(x_i - \bar{x})^2}{n-1}},$$

wherein n is a quantity of sampling times of the frequency domain component of the first current;
   the standard deviation $s_y$ of the frequency domain component of the second current y is calculated by using the following formula:

$$s_y = \sqrt{\frac{\sum(y_i - \bar{y})^2}{n-1}},$$

wherein n is a quantity of sampling times of the frequency domain component of the second current;
   the covariance $s_{xy}$ between the frequency domain component of the first current and the frequency domain component of the second current is calculated by using the following formula:

$$s_{xy} = \frac{\sum (x_i - \bar{x})(y_i - \bar{y})}{n-1};$$

and the correlation coefficient $r_{xy}$ between the frequency domain component of the first current and the frequency domain component of the second current is calculated by using the following formula:

$$r_{xy} = \frac{s_{xy}}{s_x s_y}.$$

* * * * *

UNITED STATES PATENT AND TRADEMARK OFFICE
CERTIFICATE OF CORRECTION

PATENT NO. : 11,693,062 B2
APPLICATION NO. : 16/913828
DATED : July 4, 2023
INVENTOR(S) : Fangcheng Liu, Kai Xin and Yunfeng Liu It is certified that error appears in the above-identified patent and that said Letters Patent is hereby corrected as shown below:

In the Claims

In Claim 3, Column 22, Line 36-39, delete "$s_y = \sqrt{\frac{\sum(y-y)^2}{n-1}}$," and insert --$s_y = \sqrt{\frac{\sum(y_i-\bar{y})^2}{n-1}}$,--.

In Claim 18, Column 25, Line 43-45, delete "$s_y = \sqrt{\frac{\sum(y-y)^2}{n-1}}$," and insert --$s_y = \sqrt{\frac{\sum(y_i-\bar{y})^2}{n-1}}$,--.

Signed and Sealed this
Seventeenth Day of October, 2023

Katherine Kelly Vidal
*Director of the United States Patent and Trademark Office*